United States Patent
Schreier et al.

(10) Patent No.: US 11,044,831 B2
(45) Date of Patent: Jun. 22, 2021

(54) ELECTRICAL ENCLOSURE ARRANGEMENT COMPRISING AN ELECTRICAL ENCLOSURE LINE AND A COOLING DEVICE CONNECTED INTO THE LINE

(71) Applicant: RITTAL GMBH & CO. KG, Herborn (DE)

(72) Inventors: Christoph Schreier, Leun (DE); Stefan Eibach, Dietzhoelztal (DE); Christoph Reitz, Eschenburg (DE); Steffen Wagner, Burbach (DE); Michele Vallani, Valeggio sul Minicio (IT)

(73) Assignee: RITTAL GMBH & CO. KG

( * ) Notice: Subject to any disclaimer, the term of this patent is extended or adjusted under 35 U.S.C. 154(b) by 0 days.

(21) Appl. No.: 15/565,397

(22) PCT Filed: Mar. 23, 2016

(86) PCT No.: PCT/DE2016/100142
§ 371 (c)(1),
(2) Date: Oct. 9, 2017

(87) PCT Pub. No.: WO2016/162014
PCT Pub. Date: Oct. 13, 2016

(65) Prior Publication Data
US 2018/0098456 A1      Apr. 5, 2018

(30) Foreign Application Priority Data
Apr. 10, 2015    (DE) ................. 10 2015 105 493

(51) Int. Cl.
*H05K 7/20* (2006.01)
*H05K 7/14* (2006.01)
*H05K 7/18* (2006.01)

(52) U.S. Cl.
CPC ............... *H05K 7/206* (2013.01); *H05K 7/14* (2013.01); *H05K 7/18* (2013.01); *H05K 7/20754* (2013.01)

(58) Field of Classification Search
CPC ....... H05K 7/206; H05K 7/14; H05K 7/20754
(Continued)

(56) References Cited

U.S. PATENT DOCUMENTS 5,481,429 A * 1/1996 Eriksson ................ H02B 1/56
361/678
6,102,498 A    8/2000 Kohler et al.
(Continued)

FOREIGN PATENT DOCUMENTS

DE    8807768 U1    1/1989
DE    69209828 T2   11/1996
(Continued)

OTHER PUBLICATIONS

International Search Report (in English and German) and Written Opinion of the International Searching Authority (in German) issued in PCT/DE2016/100142, dated Aug. 16, 2016; ISA/EP.
(Continued)

*Primary Examiner* — Mukundbhai G Patel
(74) *Attorney, Agent, or Firm* — Harness, Dickey & Pierce, P.L.C.

(57) ABSTRACT

The invention relates to an electrical enclosure arrangement comprising an electrical enclosure line and a cooling device connected into the line. The electrical enclosure line is formed from multiple electrical enclosures which are connected together. The invention is characterized in that the cooling device suctions hot air out of the electrical enclosures via two opposite faces, each of the faces of the cooling device adjoining a respective electrical enclosure, and blows the air back into the electrical enclosures as cooled air. At
(Continued)

Figure 1A:
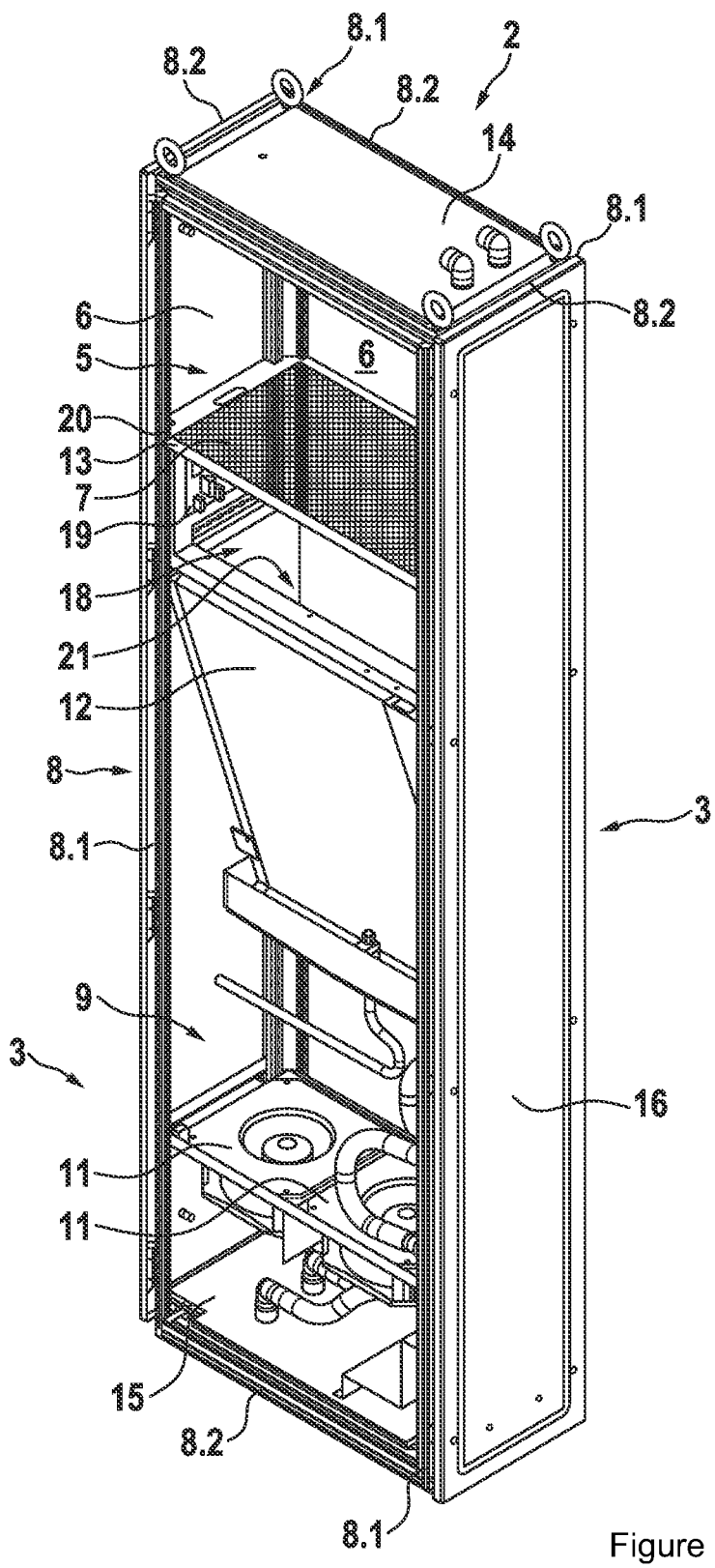

least one busbar is guided through a busbar transfer area of the cooling device between the electrical enclosures adjoining the cooling device.

6 Claims, 3 Drawing Sheets

(58) Field of Classification Search
USPC .......................................................... 361/678
See application file for complete search history.

(56) References Cited

U.S. PATENT DOCUMENTS

| | | | | |
|---|---|---|---|---|
| 7,447,022 | B2* | 11/2008 | Murakami | H05K 7/206 165/104.34 |
| 2007/0081302 | A1* | 4/2007 | Nicolai | H05K 7/20754 361/678 |
| 2008/0037217 | A1 | 2/2008 | Murakami et al. | |
| 2015/0003009 | A1* | 1/2015 | Moore | H05K 7/20781 361/679.47 |
| 2015/0156918 | A1 | 6/2015 | Nicolai et al. | |

FOREIGN PATENT DOCUMENTS

| | | |
|---|---|---|
| DE | 19647723 C1 | 4/1998 |
| DE | 19917641 A1 | 8/2000 |
| DE | 102004008460 A1 | 12/2005 |
| DE | 102006058779 A1 | 6/2008 |
| DE | 102012007707 A1 | 10/2013 |
| DE | 102012110247 A1 | 4/2014 |
| RU | 2316805 C1 | 2/2008 |
| RU | 2524181 C2 | 7/2014 |
| WO | WO-2005081091 A2 | 9/2005 |

OTHER PUBLICATIONS

First Office Action dated Sep. 4, 2018 in corresponding Chinese Application No. 201680010415.4 with English translation.
Decision on Granting a Patent for Invention in corresponding Russian Application No. 2017135517 with English translation.

* cited by examiner

ELECTRICAL ENCLOSURE ARRANGEMENT COMPRISING AN ELECTRICAL ENCLOSURE LINE AND A COOLING DEVICE CONNECTED INTO THE LINE

CROSS-REFERENCE TO RELATED APPLICATIONS

This application is a 371 U.S. National Stage of International Application No. PCT/DE2016/100142, filed on Mar. 23, 2016, which claims priority to German Application 10 2015 105 493.0, filed on Apr. 10, 2015. The entire disclosures of the above applications are incorporated herein by reference.

FIELD

The invention derives from an electrical enclosure arrangement comprising an electrical enclosure line and a cooling device connected into the line, wherein the electrical enclosure line is formed from multiple electrical enclosures which are connected together.

BACKGROUND

This section provides background information related to the present disclosure which is not necessarily prior art.

One such electrical enclosure arrangement is known from DE 10 2012 007 707 A1. Until now, in order by a busbar to electrically connect electrical enclosures with electrical enclosure arrangements known from prior art, which are separated from each other by a cooling device situated between them, it has been necessary to direct the busbar outside the electrical enclosures, for example above the electrical enclosure body and out via the cooling device situated between them. However, this requires increased space and installation expense.

SUMMARY

This section provides a general summary of the disclosure, and is not a comprehensive disclosure of its full scope or all of its features.

Therefore it is the object of the invention to further develop an electrical enclosure arrangement of the type described initially so that it permits a space-saving busbar direction between two electrical enclosures, which are separated from each other by a cooling device connected into the line.

To achieve this end, the invention proposes an electrical enclosure arrangement with the features of claim 1. The dependent claims relate to advantageous embodiments of the invention.

Accordingly, it is proposed that the cooling device suctions warm air from the electrical enclosures, from both the opposite faces via which it adjoins each of the electrical enclosures, and blows it as cooled air into the electrical enclosure, and wherein at least one busbar is directed between the electrical enclosures adjoining the cooling devices through a busbar transfer area of the cooling device.

The cooling device does not need to be limited to any particular types of devices for generation of cooled air. The cooling device can for example be an air-refrigerant-heat exchanger given through-ventilation by a fan, which forms a refrigerant circuit via an approach device and a feedback device with an external refrigerant source, such as a chiller, a return cooler or a refrigerator, and is supplied with cooled refrigerant from this.

The busbar transfer area can be opened via aligned openings in the two opposite faces toward the adjoining electrical enclosures and the at least one busbar can be guided by the aligned openings.

This can be configured so that a hot air suction opening of the cooling device empties out into the busbar transfer area, so that hot air is guided by the aligned openings from the adjoining electrical enclosures through the busbar transfer area and the hot air suction opening through the cooling device.

Provision can be made that the cooling device has a rack comprised of four vertical braces and eight horizontal braces, wherein within the installation space contoured by the rack a cooling device housing is mounted, in which at least one fan and a heat transfer device is arranged, which, on its upper side, via which the cooling device housing adjoins the busbar transfer area, has a hot air suction opening, and wherein hot air is suctioned from the at least one fan via the hot air suction opening, is directed through the heat transfer device and blown out via the cool air blowoff openings.

Additionally, the cooling device housing can have one cooling air blowoff opening on each of two facing elements situated parallel to each other and perpendicular to the upper side, both of which empty out into one of the adjoining electrical enclosures. With this, the busbar transfer area can be that section of the installation space of the cooling device rack that is above the upper side of the cooling device housing.

Likewise, the adjoining electrical enclosures can have an additional rack made of four vertical braces and eight horizontal braces, with the vertical braces and the lower braces of the three racks being dimensioned to have equal length, and with the rack of the cooling device connected on two opposite faces of the cooling device with the rack of the particular adjoining electrical enclosure, so that the inner spaces of the electrical enclosures are connected in fluid terms with each other via the busbar transfer area.

Provision can further be made that directly beneath the upper side of the cooling device housing, an installation space is configured in which at least one electrical control and regulation device is placed for operation of the cooling device, for example an inverter. The upper side can be configured as a removable and air-permeable covering, especially as a rectangular grid frame, which at each of its corners is connected with one of the four vertical braces of the rack of the cooling device.

Lastly, the hot air suction opening in the upper side of the cooling device housing can be in fluid connection via the installation space with an air inlet of the heat transfer device, so that the suctioned air flows through the installation space and directs out waste heat generated by the electrical control and regulation device.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2A:
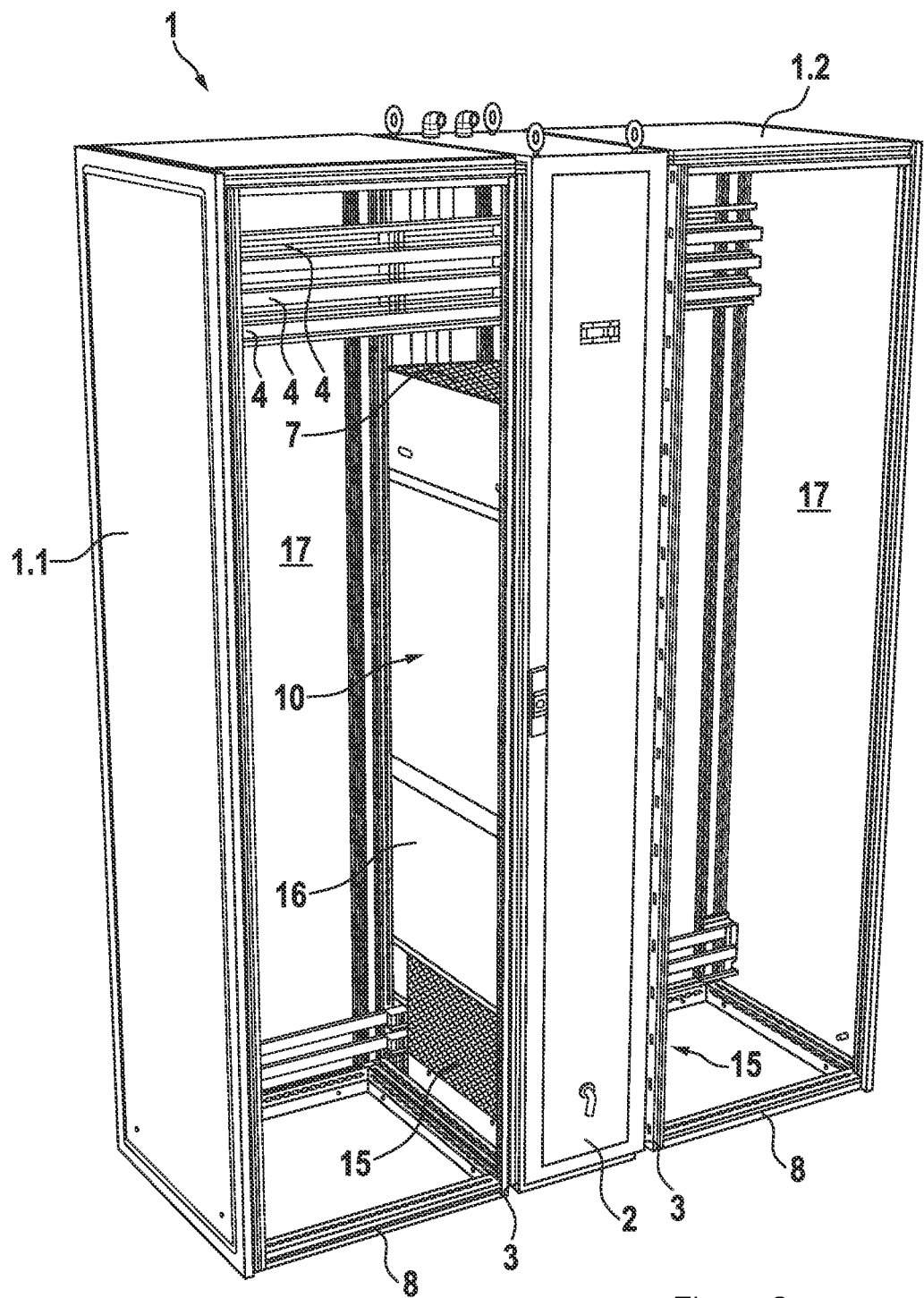
Figure 3A:
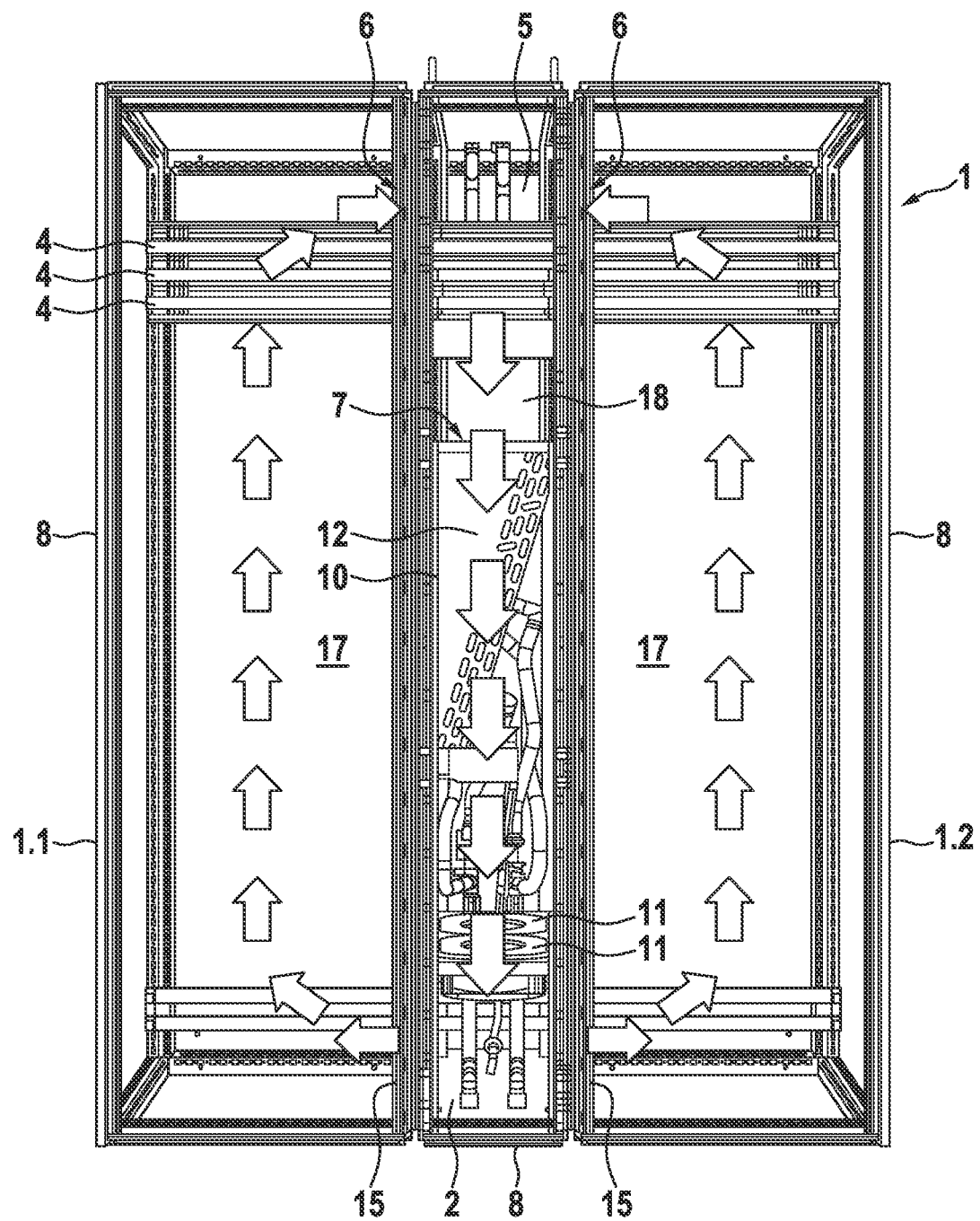

Further particulars of the invention are clarified with the aid of the figures which follow. Shown area:

FIG. 1 a shows a perspective view of an embodiment of the invention-specific cooling device FIG. 2a shows a perspective view of an embodiment of the invention-specific electrical enclosure FIG. 3a shows a schematic depiction of the air flow formed in the electrical enclosure arrangement of FIG. 2.

DETAILED DESCRIPTION

Example embodiments will now be described more fully with reference to the accompanying drawings.

The cooling device 2 shown in FIG. 1 has a rack 8 with vertical braces 8.1 and horizontal braces 8.2, which form a parallelepiped assembly body and a system of holes, via which the components essential for cooling device 2 are mounted in the interior of rack 8. The geometry of profile rails 8.1 and 8.2 can for example correspond to those of a customary frame profile, as it is known from electrical enclosure design, for example from DE 196 47 723 C1.

In a lower area of assembly room 9, an arrangement is configured of two fans 11, via which the air to be cooled is transported via a hot air intake opening 7 through heat transfer device 12, and is blown back as cooled air via cooling air blowoff opening 15 into the electrical enclosure (not shown). The hot air intake opening 7 adjoins a busbar transfer area 5, which extends through between the opposing faces 3 of cooling device 2, downwards, while busbar transfer area 5 is adjoined upwards via a roof element of cooling device 2. Hot air intake opening 7 is accommodated in an upper side of cooling device housing 10 and is a removable grid frame, which adjoins an installation space 18 of busbar transfer area 5. Installation space 18 is configured straight between heat transfer device 12 and the upper side 13 of housing 10, and serves to admit an electrical control and regulation device 19 for operation of cooling device 2, for example an inverter, so that control and regulation device 19 on the one hand is accommodated to be protected from undesired access, and on the other hand, for example in case of maintenance, is easily accessible by removal of upper side 13.

FIG. 2 shows a perspective view of an embodiment of the electrical enclosure arrangement. Especially perceptible is that the depicted electrical enclosure arrangement permits the busbars 4 to be able to run without interruption from electrical enclosure 1.1 shown on the left in the figure, through cooling device 2, namely through busbar transfer area 5 to electrical enclosure 1.2 on the right in the figure. Housing 10 of cooling device 2 extends vertically directly to hot air intake opening 7, which empties out into busbar transfer area 5. At the lower end of each of the facing elements 16 of housing 10 of cooling device 2, a cooling air blowoff opening 15 is configured, which empties out into a lower area in the interior space 17 of left electrical enclosure 1.1 or into the interior space 17 of right electrical enclosure 1.2.

FIG. 3 illustrates the air volume flow that results. The heated air in the interior spaces 17 of electrical enclosures 1.1, 1.2 passes by the aligned, lateral openings 6, via which the busbar transfer area 5 empties out into interior spaces 17, into busbar transfer area 5, in order from there to pass through hot air intake opening 7 of housing 10 of cooling device 2. After the air to be cooled passes through heat transfer device 12 and thermal energy has been exchanged, it is directed from the fans 11 as cooled air via the lower lateral cool air blowout openings 15 into the lateral walls 16 (see FIGS. 1 and 2) of housing 10, back into interior space 17 of electrical enclosures 1.1, 1.2. Thus the air volume flow illustrated by the arrows is produced.

FIG. 3 further shows that the rack of the two electrical enclosures 1.1 and 1.2 is identically configured in its vertical and depth measurements, so that a simple linear arrangement is produced via the rack from electrical enclosures 1.1, 1.2 and cooling device 2. This can occur with the aid of connection means known from prior art for electrical enclosure lines. For example, sealing elements can also be configured between adjoining vertical and horizontal braces of rack 8, in order to produce a fluid-sealed connection between cooling device 2 and the particular electrical enclosure 1.1 and 1.2.

The features of the invention disclosed in the above specification, in the drawings and in the claims, can be essential for implementation of the invention both individually and in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An electrical enclosure arrangement comprising:
a first electrical enclosure having upright side walls;
a second electrical enclosure having upright side walls; and
a cooling enclosure located between the first electrical enclosure and the second electrical enclosure, the cooling enclosure including:
upright side walls adjacent the side walls of the first electrical enclosure and the second electrical enclosure;
opposite side walls of the cooling enclosure having aligned openings;
a busbar transfer area in the cooling enclosure having at least one busbar extending from the first electrical enclosure to the second electrical enclosure through one of the aligned openings in one side wall of the cooling enclosure and through an opposite aligned opening in another side wall;
a hot air intake opening in the cooling enclosure for receiving hot air from the first and second electrical enclosures, with the cooling enclosure blowing cooled air back into the first and second electrical enclosures;
a housing mounted within the cooling enclosure;
a heat transfer device within the housing and configured to cool air flowing therethrough;
an air intake opening including a grid at an upper end of the housing, the air intake opening is adjacent the busbar transfer area;
an installation space of the housing defined between the heat transfer device and the air intake opening;
an electrical control and regulation device for the heat transfer device arranged in the installation space; and
a fan within the housing below the heat transfer device;
wherein the fan, when activated, draws air from the first electrical enclosure and the second electrical enclosure into the busbar transfer area, from the busbar transfer area into the installation space of the housing through the air intake opening, from the installation space across the heat transfer device where the air is cooled, and from the heat transfer device the fan expels air out of the housing through outlets of the housing back into the first electrical enclosure and the second electrical enclosure.

2. The electrical enclosure arrangement according to claim 1, wherein the cooling enclosure includes a rack made of four vertical braces and eight horizontal braces.

3. The electrical enclosure arrangement according to claim 2, wherein the housing arranged on two lateral elements that are parallel to each other and perpendicular to the upper side has one of the outlets, which empty out in one of the adjoining electrical enclosures.

4. The electrical enclosure arrangement according to claim 2, wherein the adjoining electrical enclosures each have an additional rack made of four vertical braces and eight horizontal braces, with the vertical braces and the lower braces of the three rack being dimensioned to be equally long and with the rack of the cooling enclosure on the two opposite faces of the cooling enclosure being connected with the rack of the particular adjoining electrical enclosure so that the interior spaces of the electrical enclosures are fluidically connected with each other through the busbar transfer area.

5. The electrical enclosure arrangement according to claim 1, wherein the grid is configured as a removable and air-permeable covering, especially as a rectangular grid frame, which on each of its four corners is connected with one of the vertical braces of the rack of the cooling device.

6. The electrical enclosure arrangement according to claim 1, wherein the air intake opening at the upper end of the housing is in fluidic connection with an air inlet of the heat transfer device, so that the suctioned air flows through the installation space and expels waste heat generated by the heat transfer device.

* * * * *